(12) United States Patent
Yoo et al.

(10) Patent No.: US 11,804,862 B2
(45) Date of Patent: Oct. 31, 2023

(54) DUAL-BAND OPERATION OF A RADIO DEVICE

(71) Applicant: Silicon Laboratories Inc., Austin, TX (US)

(72) Inventors: Euisoo Yoo, Austin, TX (US); Arup Mukherji, Austin, TX (US); Rangakrishnan Srinivasan, Austin, TX (US); Vitor Pereira, Austin, TX (US); Zhongda Wang, San Jose, CA (US); Sriharsha Vasadi, Hyderabad (IN)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 17/490,255

(22) Filed: Sep. 30, 2021

(65) Prior Publication Data

US 2023/0099832 A1 Mar. 30, 2023

(51) Int. Cl.
*H04B 1/00* (2006.01)
*H03F 3/195* (2006.01)
*H03H 7/38* (2006.01)

(52) U.S. Cl.
CPC .......... *H04B 1/0064* (2013.01); *H03F 3/195* (2013.01); *H03H 7/38* (2013.01); *H03F 2200/294* (2013.01); *H03F 2200/451* (2013.01)

(58) Field of Classification Search
CPC . H04B 1/0064; H03F 3/195; H03F 2200/294; H03F 2200/451; H03H 7/38
See application file for complete search history.

(56) References Cited

U.S. PATENT DOCUMENTS 5,280,636 A 1/1994 Kelley et al.
10,141,971 B1 * 11/2018 Elkholy .................. H04B 1/18
(Continued)

FOREIGN PATENT DOCUMENTS

DE 69913110 6/2004
DE 60030954 2/2007
(Continued)

OTHER PUBLICATIONS

Texas Instruments; "CC1352R SimpleLink™ High-Performance Multi-Band Wireless MCU," Jan. 2018—Revised Feb. 2021; 96 pgs.
(Continued)

*Primary Examiner* — Nguyen T Vo
(74) *Attorney, Agent, or Firm* — Trop, Pruner & Hu, P.C.

(57) ABSTRACT

In one embodiment, an integrated circuit includes: a first radio frequency (RF) circuit configured to receive and process a first RF signal having a sub-gigahertz (GHz) frequency to output a first lower frequency signal and to transmit RF signals having the sub-GHz frequency; a second RF circuit configured to receive and process a second RF signal having a frequency of at least substantially 2.4 GHz to output a second lower frequency signal and to transmit RF signals at the at least substantially 2.4 GHz; shared analog circuitry coupled to the first RF circuit and the second RF circuit, the shared analog circuitry to receive at least one of the first RF signal or the second RF signal and output a digital output signal; and a digital circuit coupled to the shared analog circuit, the digital circuit to recover message information from the digital output signal.

20 Claims, 7 Drawing Sheets

(56) References Cited

U.S. PATENT DOCUMENTS

| | | | | |
|---|---|---|---|---|
| 2013/0190038 A1* | 7/2013 | Noellert | ............... | H03F 3/195 |
| | | | | 455/571 |
| 2014/0370832 A1* | 12/2014 | May | ............... | H03D 7/166 |
| | | | | 455/313 |
| 2018/0019782 A1* | 1/2018 | Yun | ............... | H03F 3/19 |
| 2020/0077412 A1* | 3/2020 | Har-Zion | ............... | H04L 5/0062 |

FOREIGN PATENT DOCUMENTS

| | | |
|---|---|---|
| DE | 112006000838 | 2/2008 |
| DE | 102006006291 | 7/2011 |
| EP | 2587667 | 5/2013 |

OTHER PUBLICATIONS

U.S. Appl. No. 17/363,049, filed Jun. 30, 2021, entitled "Dual-Mode Power Amplifier For Wireless Communication," by Ruifeng Sun et al.
German Patent Office, Office Action dated Jul. 21, 2023 in German Patent Application No. 10 2022 121 6724 (18 pages).

* cited by examiner

DUAL-BAND OPERATION OF A RADIO DEVICE

BACKGROUND

As wireless-enabled devices become more and more prevalent, protocols that operate at widely different frequency bands are used. Some devices may provide for operation at multiple frequency bands, and can implement different radio frequency (RF) circuitry to communicate at these different frequency bands.

One difficulty in providing multiple RF circuits in a single integrated circuit is the size and complexity of circuitry such as matching networks needed to interface antennas with the RF circuits. As such, some wireless-enabled devices may limit communication to a single frequency band or use separate integrated circuits for each frequency band; others opt for the increased expense, size and power consumption of fully integrating circuitry for multiple protocols. None of these scenarios affords maximum flexibility.

SUMMARY OF THE INVENTION

In one aspect, an integrated circuit includes a semiconductor die, which may include: a first radio frequency (RF) circuit including a first low noise amplifier (LNA) and a first mixer, the first RF circuit configured to receive and process a first RF signal having a sub-gigahertz (GHz) frequency to output a first lower frequency signal and to transmit RF signals having the sub-GHz frequency; a second RF circuit including a second LNA and a second mixer, the second RF circuit configured to receive and process a second RF signal having a frequency of at least substantially 2.4 GHz to output a second lower frequency signal and to transmit RF signals at the at least substantially 2.4 GHz; shared analog circuitry coupled to the first RF circuit and the second RF circuit, the shared analog circuitry to receive at least one of the first RF signal or the second RF signal and output a digital output signal; and a digital circuit coupled to the shared analog circuit, the digital circuit to recover message information from the digital output signal.

In an embodiment: the first RF circuit is coupled to a first matching network, the first matching network configured to impedance match to a first antenna, the first antenna to receive the first RF signal; and the second RF circuit is coupled to a second matching network, the second matching network configured to impedance match to a second antenna, the second antenna to receive the second RF signal. The integrated circuit may couple to the first matching network via a first pad of the semiconductor die and to couple to the second matching network via a second pad of the semiconductor die, the first matching network and the second matching network external to the integrated circuit. A programmable harmonic filter may be coupled to the second matching network, where the programmable harmonic filter is enabled when communication is via the first RF circuit, to prevent emission of the first RF signal through the second matching network.

In an embodiment, the integrated circuit further comprises a controller coupled to the first RF circuit and the second RF circuit, wherein in a first mode, the controller is to disable the first RF circuit and enable the second RF circuit, the controller to communicate onboarding information with a network component of a network via the second RF circuit. After the integrated circuit is onboarded into the network based at least in part on the onboarding information, the controller is to disable the second RF circuit and enable the first RF circuit.

When the integrated circuit is integrated in a system, the first RF circuit and the second RF circuit are configured for operation at the sub-GHz frequency, the first RF circuit is to couple to a first antenna and the second RF circuit comprises a diversity path to be coupled to a diversity antenna, where the first antenna and the diversity antenna are configured for a same band of operation.

In an embodiment, the shared analog circuit comprises: a programmable gain amplifier to receive the first lower frequency signal when the first RF circuit is active and to receive the second lower frequency signal when the second RF circuit is active; and an analog-to-digital converter (ADC) coupled to an output of the programmable gain amplifier, the ADC to output the digital output signal to the digital circuit. The semiconductor die may further comprise a frequency synthesizer to generate a first mixing signal for the first mixer when the first RF circuit is active and to generate a second mixing signal for the second mixer when the second RF circuit is active, where the first mixer and the second mixer comprise a shared complex mixer.

In another aspect, a method includes: impedance matching between at least one antenna and a first RF circuit of an integrated circuit with a first matching network, the first RF circuit configured for processing first RF signals of a sub-GHz protocol; impedance matching between the at least one antenna and a second RF circuit of the integrated circuit with a second matching network, the second RF circuit configured for processing second RF signals of a 2.4 GHz protocol; receiving and processing impedance matched first RF signals of the sub-GHz protocol using the first RF circuit; and receiving and processing impedance matched second RF signals of the 2.4 GHz protocol using the second RF circuit.

In an embodiment, the method further comprises: coupling the first RF signals from the at least one antenna to the first RF circuit via the first matching network comprising a first off-chip matching network and a first input pad of the integrated circuit coupled to the first off-chip matching network; and coupling the second RF signals from the at least one antenna to the second RF circuit via the second matching network comprising a second off-chip matching network and a second input pad of the integrated circuit coupled to the second off-chip matching network. The method may further comprise in a first mode, disabling the first RF circuit and enabling the second RF circuit to communicate onboarding information with a network component of a network. After the integrated circuit is onboarded into the network based at least in part on the onboarding information, the method may include disabling the second RF circuit and enabling the first RF circuit to communicate according to the sub-GHz protocol.

In yet another aspect, a system includes: at least one antenna to receive RF signals of a sub-GHz protocol and RF signals of a 2.4 GHz protocol; a first matching network coupled to the at least one antenna, the first matching network to impedance match the at least one antenna and a first RF circuit of an integrated circuit; a second matching network coupled to the at least one antenna, the second matching network to impedance match the at least one antenna and a second RF circuit of the integrated circuit; the integrated circuit coupled to the first matching network and the second matching network, the integrated circuit comprising: the first RF circuit including a first LNA, the first RF circuit configured to receive and process the RF signals of the sub-GHz protocol; the second RF circuit including a second LNA, the second RF circuit configured to receive and process the RF signals of the 2.4 GHz protocol; shared circuitry coupled to the first RF circuit and the second RF circuit, the shared circuitry to receive at least one of the RF signals of the sub-GHz protocol or the RF signals of the 2.4 GHz protocol and output a digital output signal; and a digital circuit coupled to the shared circuitry, the digital circuit to recover message information from the digital output signal.

In an embodiment, at least one of the first matching network or the second matching network is external to the integrated circuit. The first matching network may comprise: a first matching network path having at least one first inductor coupled in series between the at least one antenna and the first RF circuit and at least one first capacitor coupled in parallel to the at least one first inductor; and a second matching network path having at least one second inductor coupled in series between the at least one antenna and at least one power amplifier of the first RF circuit and at least one second capacitor coupled in parallel to the at least one second inductor.

In an embodiment, the system may further comprise a controller coupled to the first RF circuit and the second RF circuit, where in a first mode, the controller is to disable the first RF circuit and enable the second RF circuit, the controller to communicate onboarding information with a network component of a network via the second RF circuit. After the system is onboarded into the network based at least in part on the onboarding information, the controller may disable the second RF circuit and enable the first RF circuit.

In an embodiment, the system further comprises a programmable harmonic filter coupled to the second matching network, where the programmable harmonic filter is enabled when communication is via the first RF circuit, to prevent emission of a harmonic of the RF signals of the sub-GHz protocol through the second matching network. The programmable harmonic filter may have a programmable capacitor included in the integrated circuit and an inductor coupled between the programmable capacitor and the at least one antenna, where the programmable capacitor is decoupled from the inductor when communication is via the second RF circuit.

In an embodiment, the system may further comprise a RF switch coupled between the at least one antenna, and the first and second matching networks. The system may further comprise a controller coupled to the first RF circuit and the second RF circuit, where when the system comprises a vehicle system, the controller is to configure the first RF circuit and the second RF circuit to receive and process the RF signals of the sub-GHz protocol.

DETAILED DESCRIPTION

In various embodiments, an integrated circuit (IC) includes transceiver circuitry to enable wireless communication. This transceiver circuitry may include both transmit and receive circuitry, at least some of which may be shared. In embodiments herein, the integrated circuit may include multiple independent radio frequency (RF) signal processing paths to enable communication at different bands of operation. In particular embodiments, the integrated circuit may be configured for dual-band operation in which a first RF signal processing path is configured for operation at a relatively high frequency range (e.g., a frequency of 2.4 gigahertz (GHz) such as may be used for a Bluetooth protocol (e.g., a Bluetooth or Bluetooth Low Energy (BLE) protocol), a protocol in accordance with an IEEE 802.11 standard, or another protocol.

In turn, the other RF signal processing path may be configured for operation at a sub-GHz band. For example, wireless communications, e.g., of a wireless local area network (WLAN) such as an automation network, may occur between approximately 170 megahertz (MHz) and 900 MHz. Embodiments may be used in connection with many different types of sub-GHz wireless protocols, such as a Z-Wave, Thread SubG, Wi-SUN and/or Sidewalk protocols, among other such protocols. Of course embodiments are not limited to dual-band operation, and in some situations more than two bands of operation may be enabled using two or more RF signal processing paths.

The IC may be designed with specific components to enable operation at these dual bands (2.4 GHz and sub-GHz, as an example implementation), such as by way of inclusion of matching components or so forth. However in other cases, the IC may be designed more generically. In these cases, the IC may include separate independent RF signal processing paths and shared circuitry that, depending upon use case, can be configured for operation at the same band (such as for use in a diversity receiver situation) or configured for operation at bands of widely different frequencies such as the example of 2.4 GHz and sub-GHz that will be the focus of the discussion herein. In this way, a single IC design can be implemented in many different use cases by leveraging common on-chip hardware and using particular off-chip hardware such as matching networks to enable operation at desired bands for a given use case.

Figure 1:
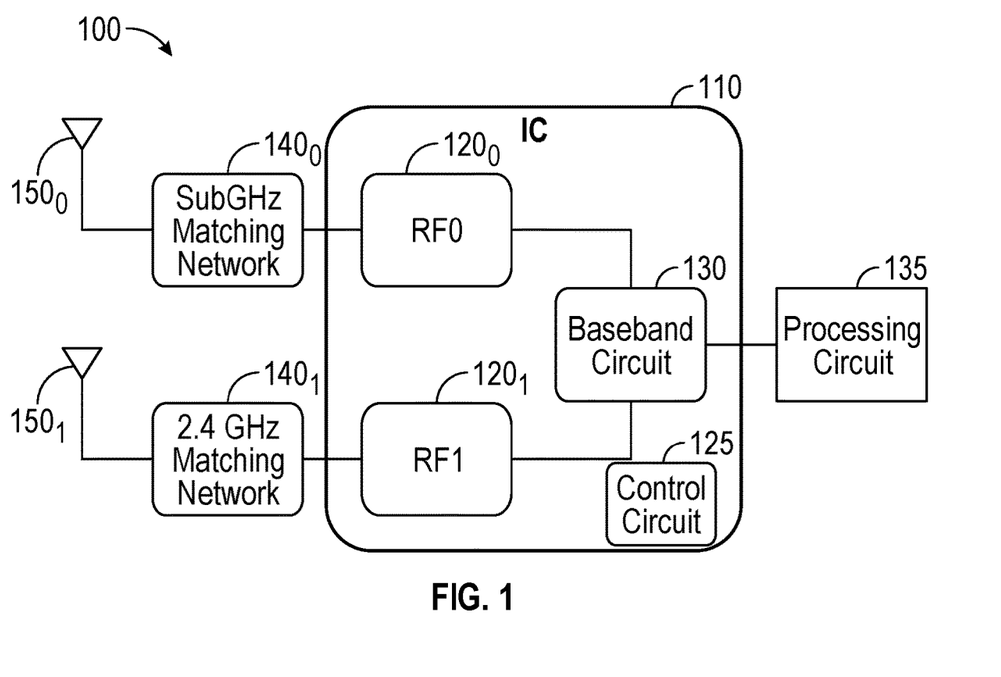
FIG. 1 is a block diagram of a system in accordance with an embodiment.

Referring now to FIG. 1, shown is a block diagram of a system in accordance with an embodiment. As shown in FIG. 1, system 100 may be any type of wireless-enabled device. While embodiments herein may be particularly adapted for use in Internet of Things (IoT) devices, understand embodiments are not limited in this regard, and other wireless-enabled devices such as various consumer portable devices including portable computers, smartphones, media players, and so forth, also may leverage embodiments.

In the high level shown in FIG. 1, system 100 includes an integrated circuit 110. In embodiments, integrated circuit 110 may be a main controller for system 100, such as a microcontroller unit (MCU). In other cases, IC 110 may be implemented as a standalone transceiver that has transmit and receive capabilities. In any event, IC 110 has multiple independent RF signal processing paths, including a first RF front end circuit 120$_0$ and a second RF front end circuit 120$_1$. At a high level, RF front end circuits 120 (generically) may include various circuitry to receive and transmit RF signals and further to interface with additional signal processing circuitry. As such, RF front end circuits 120 may include mixing circuitry to downconvert/upconvert signals between RF and a lower frequency such as an intermediate frequency (IF) and/or baseband. In addition RF front end circuits 120 further may include signal conditioning circuitry such as amplifiers and/or other gain control circuitry, filtering circuitry and so forth. In some cases, there may be additional circuitry within the separate RF front end circuits, such as mixers or other downconversion circuitry.

Still with reference to FIG. 1, a control circuit 125 is present and may be configured to control operation. For example, control circuit 125 may dynamically enable and disable selected ones of RF front end circuits 120, depending on a desired protocol for a given environment. Such operation may result from a negotiation with a network component. Further details of control circuit 125 operation are described below.

As further shown in FIG. 1, RF front end circuits 120 couple with a baseband circuit 130. While shown as a single baseband circuit, understand that at least portions of baseband circuit 130 may be separately implemented for the different signal processing paths. For example, different modem circuitry may be provided to enable modulation and demodulation of signals of different wireless protocols and so forth. In some embodiments, baseband circuit 130 may be implemented as a digital signal processor (DSP) or other digital circuit to recover message information from digitized signals obtained from received RF signals.

In turn, baseband circuit 130 may communicate digital information with a processing circuit 135, which may be a main processor such as a host processor of system 100. In other cases understand that processing circuit 135 may be present within IC 110, and may be implemented as a MCU. Of course additional circuitry may be present in IC 110 and system 100 but is not shown for ease of illustration in FIG. 1.

As further shown in FIG. 1, IC 110 couples to multiple independent matching networks $140_{0,1}$. In particular embodiments, matching networks 140 may be implemented off-chip. By providing external matching networks separate from IC 110, the size, complexity and cost of IC 110 may be reduced. Furthermore, greater flexibility may be realized by providing off-chip matching, since a much larger range of frequencies can be accommodated in this way.

In particular implementations described herein, matching network $140_0$ may be configured to provide sub-GHz matching, while matching network $140_1$ may be configured to provide 2.4 GHz matching. While different implementations of matching networks 140 are possible, in this high level view of FIG. 1, understand that matching networks 140 can be implemented as LC circuits.

As further shown, each matching network 140 couples to a separate antenna $150_{0,1}$, respectively. In embodiments, each antenna 150 may be configured to receive signals of a particular band or bands, and may be differently configured. That is, antennas 150 may be configured for receiving and transmitting signals of different frequency bands, in contrast to a diversity arrangement in which multiple antennas are configured for operation at the same band, although at different phases. Understand while shown at this high level in the embodiment of FIG. 1, many variations and alternatives are possible. For example, in some cases, at least one of matching networks 140 may be included within IC 110. Also, a single antenna (e.g., a dual-resonant antenna) may be used, with a RF switch coupled between matching networks 140 and this antenna.

Figure 2:
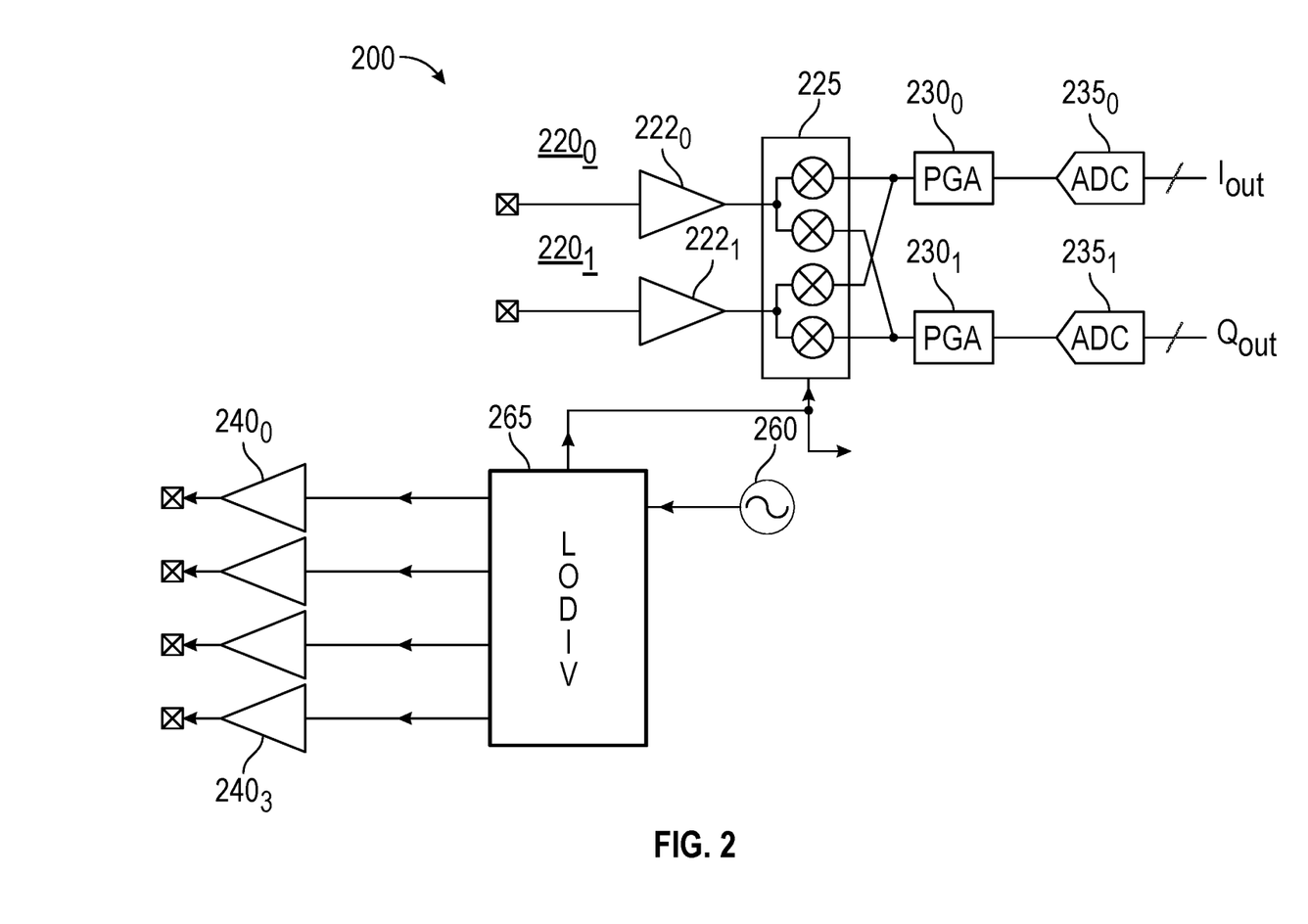
FIG. 2 is a block diagram of further details of circuitry within an integrated circuit in accordance with an embodiment.

Referring now to FIG. 2, shown are further details of circuitry within an integrated circuit in accordance with an embodiment. As shown in FIG. 2, IC 200, which is a more detailed view of IC 110 of FIG. 1, includes independent RF signal processing paths. In the high level shown in FIG. 2, these independent RF signal processing paths (generally $220_0$ and $220_1$) include, in a receive direction, low noise amplifiers (LNAs) $222_0$, $222_1$ to receive and amplify incoming RF signals of a given band. As shown, LNAs 222 are coupled to input pins or pads (that in turn may couple to off-chip matching networks). In this way incoming RF signals are impedance matched between the circuitry of RF signal processing paths 220 and an off-chip antenna.

In turn, resulting amplified RF signals are provided to mixing circuitry 225 which, in the embodiment shown in FIG. 2, is implemented as a shared complex mixer. Note that this shared circuitry includes separate mixing paths for the independent RF signal processing paths. Mixer 225 may be configured to downconvert the RF signals to a lower frequency. In some implementations, this downconversion may be performed to downconvert the RF signals to an IF level, a low-IF level, a zero-IF level, or even baseband. Depending on implementation, mixer 225 may instead be separated into dedicated mixers each associated with one of RF signal processing paths 220.

With continued reference to FIG. 2, the downconverted signals are provided to complex paths, namely an in-phase (I) path and a quadrature-phase (Q) path. As shown, these paths include corresponding programable gain amplifiers (PGAs) $230_{0,1}$, which may perform additional gain control. The resulting signals are then digitized in corresponding analog-to-digital converters (ADCs) $235_{0,1}$.

Note that RF front end circuits 220 further include power amplifiers in a transmit direction. In the high level view of FIG. 2, multiple power amplifiers (PAs) $240_0$-$240_3$ may be provided such that signals of controllable power levels can be provided to a given one of multiple output paths, namely the dual output paths in this implementation. In an embodiment, for each path a corresponding low power PA and high power PA may be provided. As shown, PAs 240 are coupled to output pins or pads (that in turn may couple to the off-chip matching networks as described herein).

As further illustrated in FIG. 2, a local oscillator (LO) 260 is present. In embodiments herein, the ability to provide independent RF signal processing paths that operate at widely divergent bands of operation may be realized at least in part via LO 260, which outputs an LO signal to a LO frequency divider (LODIV) 265. These components may collectively form a frequency synthesizer that may be programmably controlled to output mixing signals used for down converting incoming RF signals of a wide frequency range (e.g., at least in the 2.4 GHz and sub-GHz ranges described above) and for upconversion from baseband to these RF frequencies in a transmit direction. Thus, as shown, LODIV 265 couples both to receiver path components and transmitter path components of RF front end circuits $220_{0,1}$. With the implementation shown in FIG. 2, some amount of hardware sharing between the two paths is realized to reduce area and complexity.

By avoiding on-chip matching network(s), complexities of designing such components for wide frequency ranges is avoided. In this way, a single IC can be implemented in many different systems to handle RF communications at a wide range of frequency bands. In addition, note that the independent RF signal processing paths may in other use cases be used for diversity operation, such that both signal processing paths are configured to operate at the same frequency band to process signals received by diversity antennas. Such diversity use cases may include, for example, a vehicle entertainment system in which diversity antennas are present within a vehicle environment to enable smoother reception of RF signals as the vehicle is traveling.

In fact, in some embodiments it is possible that the IC may be initially designed for diversity operation by providing redundant RF paths, which may be designed initially for sub-GHz operation. This designed IC may be incorporated into a dual-mode wireless-enabled device that can communicate in both sub-GHz and 2.4 GHZ networks using this diversity hardware. Stated another way, with embodiments this IC may, in a given system implementation, be configured with one RF signal processing path to couple to an off-chip sub-GHz matching network and with another RF signal processing path to couple to an off-chip 2.4 GHz matching network. In this way, performance optimization may be realized for each band, while allowing dual-band operation without adding any additional hardware. When configured in such system, this IC may receive and transmit both in sub-GHz and 2.4 GHz bands non-simultaneously, without compromising performance in either band.

Figure 3A:
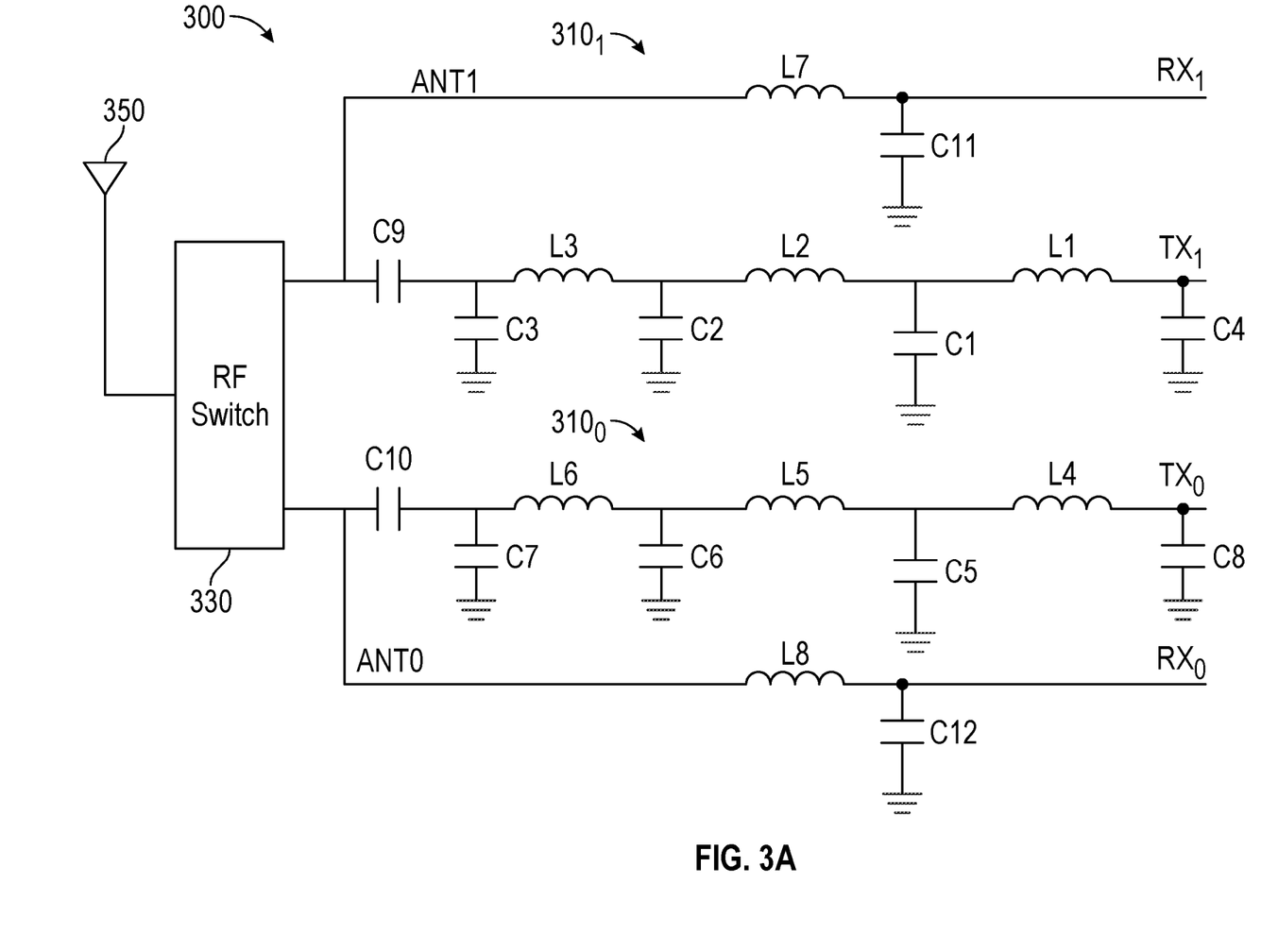
FIG. 3A is a schematic diagram of multiple matching networks in accordance with an embodiment.

Referring now to FIG. 3A, shown is a schematic diagram of multiple matching networks in accordance with an embodiment. As shown in FIG. 3A, an apparatus 300 such as a given IoT device includes multiple matching networks, namely matching networks $310_0$ and $310_1$. In embodiments herein, matching networks 310 (generically) may be implemented as off-chip components, enabling greater flexibility of an IC to be used with devices that may operate with wide frequency ranges in multiple bands.

In an embodiment, with a device configured such that one RF path is operating on sub-GHz frequency and other in the 2.4 GHz frequency range, there can be instances where a harmonic frequency of one band is close to the fundamental frequency of the other band. For example, a sub-GHz path may transmit in the 868 MHz band and the 2.4 GHz path is configured to transmit in the 2.4 GHz band, where 3*868 (2.6 GHz) is close to 2.4 GHz. In such cases, the matching network of one path provides a good transmission path for the harmonic frequency of the other and can lead to problems with harmonic emission.

Different implementations may be used to alleviate such scenarios. In FIG. 3A, a RF switch 330 (in turn coupled to an antenna 350) may decouple the inactive matching network.

With specific reference to FIG. 3A, a first matching network $310_0$ has different matching network paths for transmit and receive, and both are coupled between RF switch 330 and respective transmit and receive paths. Note that the components of matching network $310_0$ may be implemented on a circuit board to which an integrated circuit (such as IC 110) couples. In the receive direction, first matching network $310_0$ has an LC network formed of a series inductor L8 and a parallel-connected capacitor C12 coupled between this receive path of matching network $310_0$ and a reference voltage node (e.g., ground). In a transmit direction, first matching network $310_0$ has multiple series-connected inductors L4-L6 and a series-connected capacitor C10, along with parallel-connected capacitors C5-C8.

Similarly, second matching network $310_1$ has different matching network paths for transmit and receive, and both are coupled between RF switch 330 and respective transmit and receive paths. As above, the components of matching network $310_1$ may be implemented on a circuit board. In the receive direction, second matching network $310_1$ has an LC network formed of a series inductor L7 and a parallel-connected capacitor C11. In a transmit direction, second matching network $310_1$ has multiple series-connected inductors L1-L3 and a series-connected capacitor C9, along with parallel-connected capacitors C1-C4. Note in other implementations, C11 may instead be implemented as another inductor.

Referring now to Table 1, shown are example values of different inductors and capacitors of a matching network in accordance with an embodiment.

TABLE 1

| Band | Power dBm | TX | | | | | | | | RX | |
| --- | --- | --- | --- | --- | --- | --- | --- | --- | --- | --- | --- |
| | | C4 | L1 | C1 | L2 | C2 | L3 | C3 | C9 | C11 | L7 |
| 868/915 | 14 | NP | 4.2 nH | 5.9 pF | 16 nH | 2.1 pF | OR | NP | 220 pF | NP | 18 nH |
| 868/915 | 10 | NP | 5.6 nH | 5.1 pF | 13 nH | 3.1 pF | OR | NP | 220 pF | NP | 18 nH |
| 433 | 10 | NP | 20 nH | 8.5 pF | 39 nH | 4.6 pF | OR | NP | 220 pF | NP | 82 nH |
| 315 | 10 | NP | 22 nH | 15 pF | 47 nH | 9.2 pF | OR | NP | 220 pF | NP | 150 nH |
| 2450 | 10 | NP | 1.8 nH | 1.2 pF | 8.2 nH | 0.3 pF | OR | NP | 220 pF | 1.8 nH (inductor) | 3.1 nH |

In above Table, note that "NP" stands for not populated (open circuit), and "OR" stands for zero ohm resistor (short circuit). Understand while shown with these particular values for exemplary purposes, embodiments are not limited to these values and different values may be used in other embodiments. Furthermore, while a particular implementation of matching networks is shown in FIG. 3A, understand that other topologies of LC matching networks may be used in other embodiments.

Without presence of RF switch 330 it is possible that in the arrangement of FIG. 3A standing alone may result in leakage from an inactive antenna. That is, a harmonic (e.g., third harmonic) from the sub-GHz band could land in the operating frequency of 2.4 GHz band, and with coupling through ground, printed circuit board traces and bond wires, could leak right out through the off antenna, without any attenuation from matching network 310, violating FCC or ETSI radiated emission limits.

In such cases, the matching network of one path provides a good transmission path for the harmonic frequency of the other and can lead to problems with harmonic emission. Different implementations may be used to alleviate such scenarios. In FIG. 3A, RF switch 330 may decouple the inactive matching network, providing isolation in the "off" path and antenna. In addition, only a single antenna is needed, by implementing a single pole double throw (SPDT) RF switch. In other cases, a double pole double throw (DPDT) RF switch may be used where two antennas are desired (e.g., for diversity purposes).

Figure 3B:
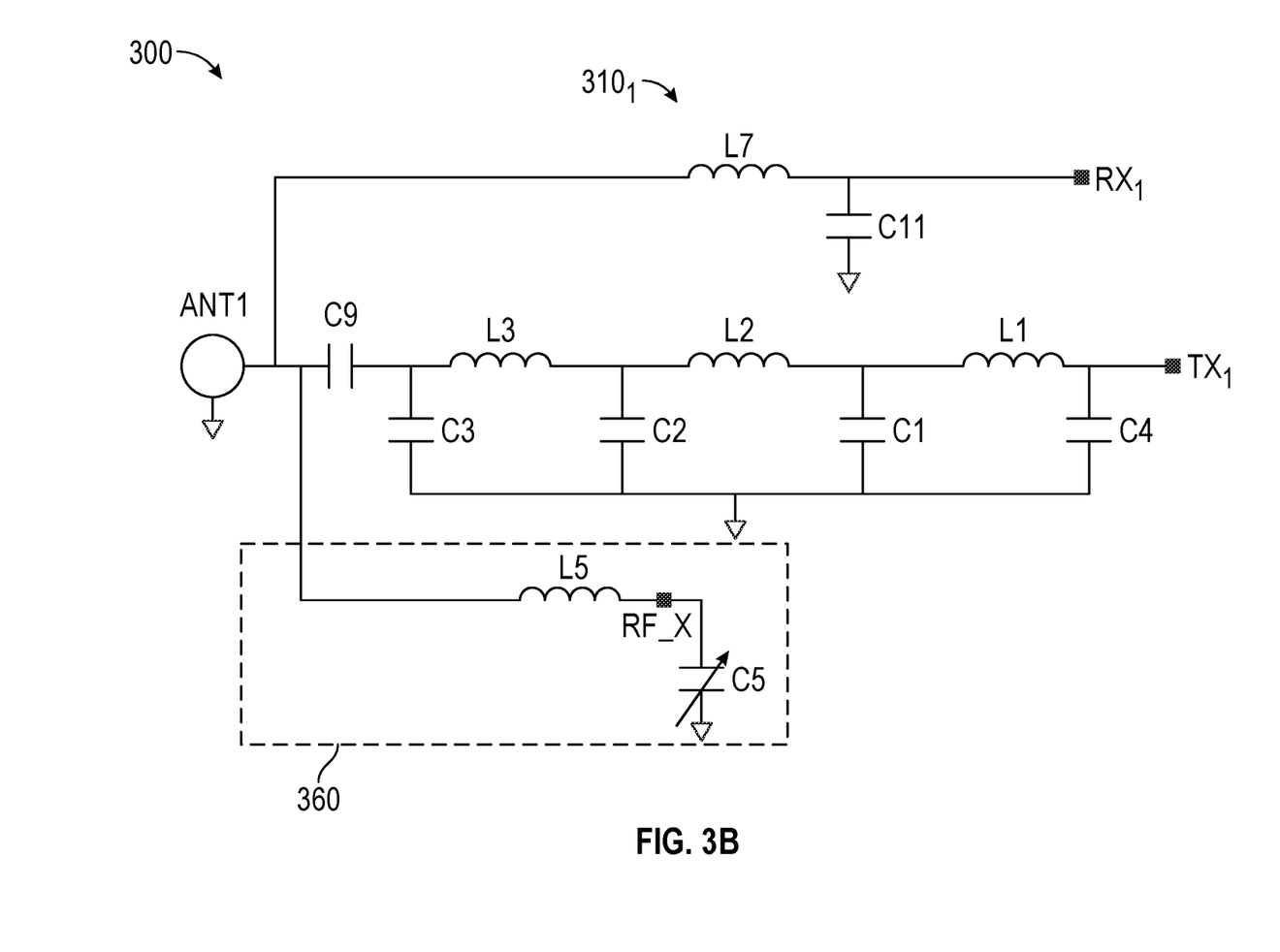
FIG. 3B is a schematic diagram of a matching network in accordance with another embodiment.

In another case, a programmable harmonic filter trap may be included. Referring now to FIG. 3B, shown is a schematic diagram of a matching network in accordance with another embodiment. As shown in FIG. 3B, in apparatus 300', only matching network 310$_1$ is shown for ease of illustration (to be used for a 2.4 GHZ path). In this implementation, a programmable harmonic filter 360 is shown as an optional component (in a dashed box). As shown, programmable harmonic filter 360 includes an inductor L5 and a programmable capacitor C5, coupled between an antenna pin and a reference voltage node. Note that capacitor C5 may be implemented on die, to provide flexibility for different frequencies, and to controllably switch it on or off (as described below). In embodiments, the values of L5 and C5 may satisfy the relationship, $\omega^2=1/\sqrt{(L5*C5)}$, where $\omega$ refers to the frequency where harmonic emission is a problem.

With this arrangement, when the device is transmitting on ANT0 (i.e., for the sub-GHz band), programmable harmonic filter 360 may be configured as per the relation above. As such, the majority of harmonic energy from transmission flows through L5/C5 and does not emit out from ANT1. However, when it is desired to transmit on ANT1 at a frequency close to a harmonic (e.g., 2.4 GHz), it is undesirable to have L5/C5 configured as per relation above. Instead, programmable capacitor C5 can be switched off. In this manner, the impedance presented by L5 and C5 (with C5 switched off) can be absorbed into matching network 310$_1$. While shown with this implementation in FIG. 3B, other configurations are possible. Furthermore note that the separate RF paths on-chip may be implemented with separate grounds, to reduce coupling through a shared ground.

Figure 4:
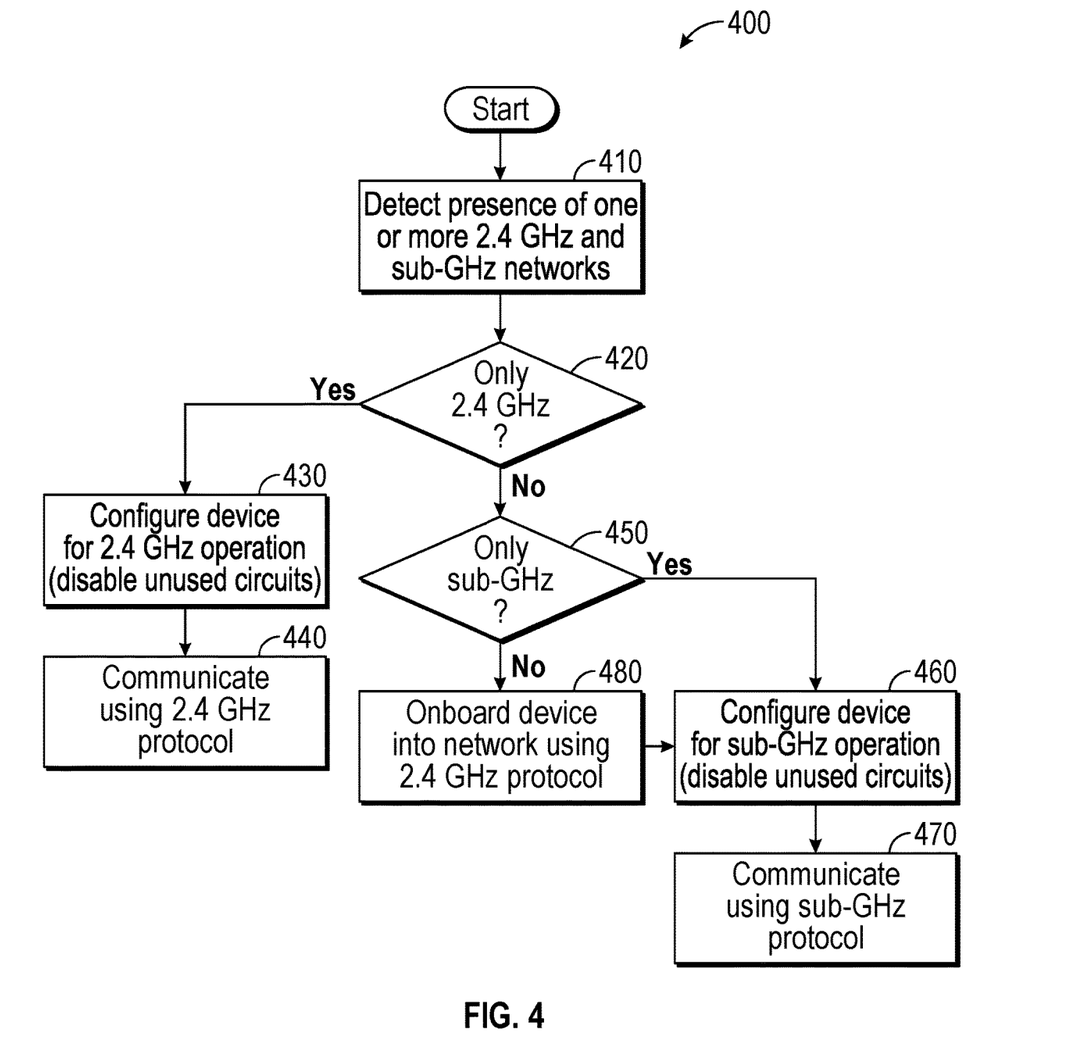
FIG. 4 is a flow diagram of a method in accordance with an embodiment.

Referring now to FIG. 4, shown is a flow diagram of a method in accordance with an embodiment. More specifically, method 400 of FIG. 4 is a high level method for operating a dual-mode radio device in accordance with an embodiment. As such, method 400 may be performed using an IC as described herein, which may include hardware circuitry such as a controller that, alone or in combination with firmware and/or software, may execute programmable instructions for controlling the IC as implemented in an end user device to operate in multiple modes.

As illustrated, method 400 begins by detecting presence of one or more 2.4 GHz and sub-GHz networks (block 410). For example, when an IoT device is powered on, a scan may be performed to identify the presence of such networks. Based on this detection, it is determined at diamond 420 whether there is only a 2.4 GHz network present. If so, control passes to block 430 where the device may be configured for 2.4 GHz operation. As part of this configuration, unused circuitry, such as one or more other RF circuits may be disabled, thus reducing power consumption. In this network environment, communication may occur using a 2.4 GHz protocol (block 440).

Still with reference to FIG. 4, instead if it is determined that there is only a sub-GHz network present as determined at diamond 450, control passes to block 460, where the device may be configured for sub-GHz operation, and unused circuitry may be disabled. In this network environment, communication may occur using a sub-GHz protocol (block 470). Note that the determinations at diamonds 420 and 450 may proceed in opposite order in some cases.

With continued reference to FIG. 4, if it is determined that there are multiple networks, including at least one 2.4 GHz network and at least one sub-GHz network, control passes to block 480. At block 480 the device may be onboarded into the sub-GHz network using a 2.4 GHz protocol. For example, a BLE onboarding process may be performed to onboard the device into the sub-GHz network. Thereafter, once onboarded, control passes to block 460 such that the device is configured to operate in the sub-GHz network. In this way, a BLE onboarding process may be performed to enable inclusion of the device within the sub-GHz network. Then continued operation proceeds within that sub-GHz network. Accordingly, the unused circuitry (e.g., at least one of the RF circuits) may be powered off.

While described in this onboarding example, understand that other implementations are possible where operation may dynamically switch modes between a sub-GHz protocol and a 2.4 GHz protocol, e.g., depending upon network activity and so forth. In all these cases, determination of mode (including frequency band for a given protocol) may be based at least in part on communication with a network component such as a network controller of a wireless control network.

Figure 5:
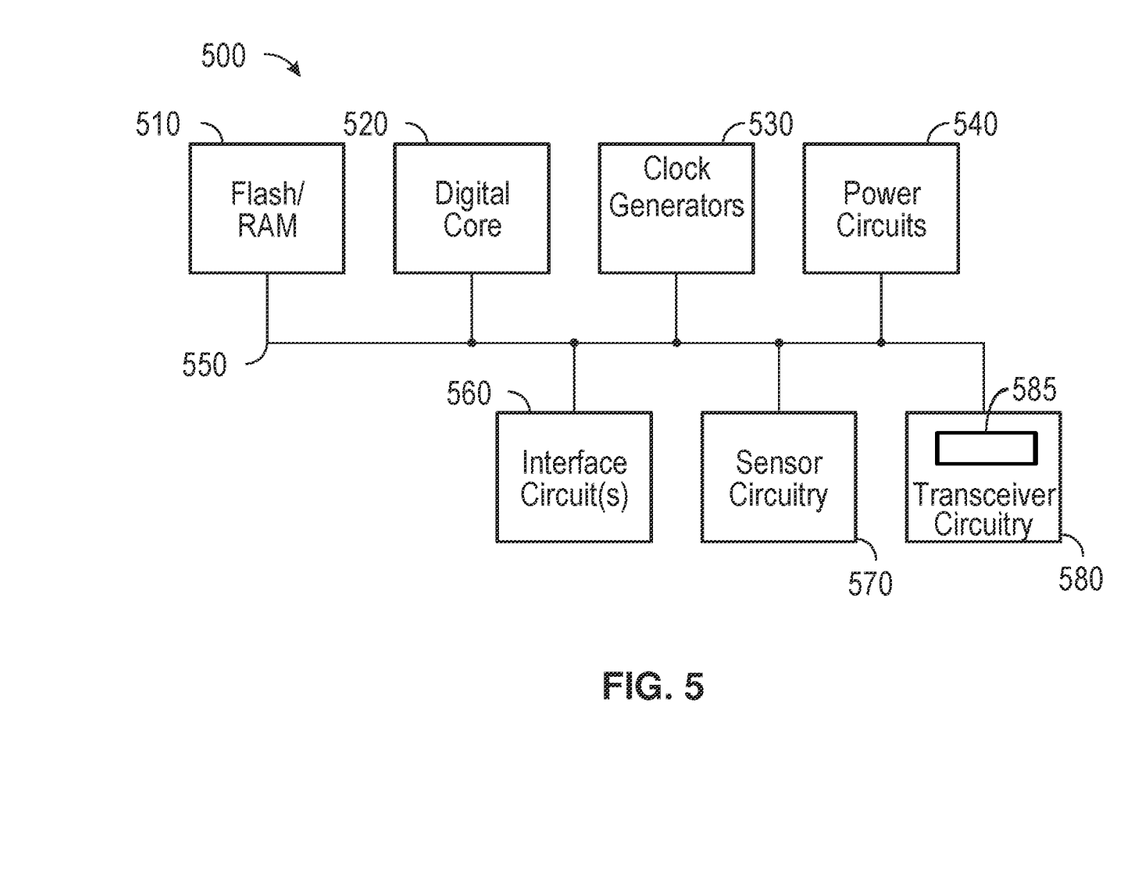
FIG. 5 is a block diagram of a representative integrated circuit in accordance with an embodiment.

Embodiments can be implemented in many different environments. Referring now to FIG. 5, shown is a block diagram of a representative integrated circuit 500 that can be configured for dual bands of operation, using matching networks as described herein. In the embodiment shown in FIG. 5, integrated circuit 500 may be, e.g., a microcontroller, wireless transceiver that may operate according to one or more wireless protocols (e.g., WLAN-OFDM, WLAN-DSSS, Bluetooth, among others), or other device that can be used in a variety of use cases, including sensing, metering, monitoring, embedded applications, communications, applications and so forth, and which may be particularly adapted for use in an IoT device.

In the embodiment shown, integrated circuit 500 includes a memory system 510 which in an embodiment may include a non-volatile memory such as a flash memory and volatile storage, such as RAM. In an embodiment, this non-volatile memory may be implemented as a non-transitory storage medium that can store instructions and data. Such non-volatile memory may store instructions, including instructions for determining appropriate configuration of matching networks in accordance with an embodiment for a given mode of operation.

Memory system 510 couples via a bus 550 to a digital core 520, which may include one or more cores and/or microcontrollers that act as a main processing unit of the integrated circuit. In turn, digital core 520 may couple to clock generators 530 which may provide one or more phase locked loops or other clock generator circuitry to generate various clocks for use by circuitry of the IC.

As further illustrated, IC 500 further includes power circuitry 540, which may include one or more voltage regulators. Additional circuitry may optionally be present depending on particular implementation to provide various functionality and interaction with external devices. Such circuitry may include interface circuitry 560 which may provide interface with various off-chip devices, sensor circuitry 570 which may include various on-chip sensors including digital and analog sensors to sense desired signals, such as for a metering application or so forth.

In addition as shown in FIG. 5, transceiver circuitry 580 may be provided to enable transmission and receipt of wireless signals, e.g., according to one or more of a local area or wide area wireless communication scheme, such as Zigbee, Bluetooth, IEEE 802.11, IEEE 802.15.4, cellular communication or so forth. As shown, transceiver circuitry 580 includes dual RF paths 585 that may couple to off-chip matching networks as described herein. Understand while shown with this high level view, many variations and alternatives are possible.

Note that ICs such as described herein may be implemented in a variety of different devices such as an IoT device. This IoT device may be, as two examples, a smart bulb of a home or industrial automation network or a smart utility meter for use in a smart utility network, e.g., a mesh network in which communication is according to an IEEE 802.15.4 specification or other such wireless protocol.

Figure 6:
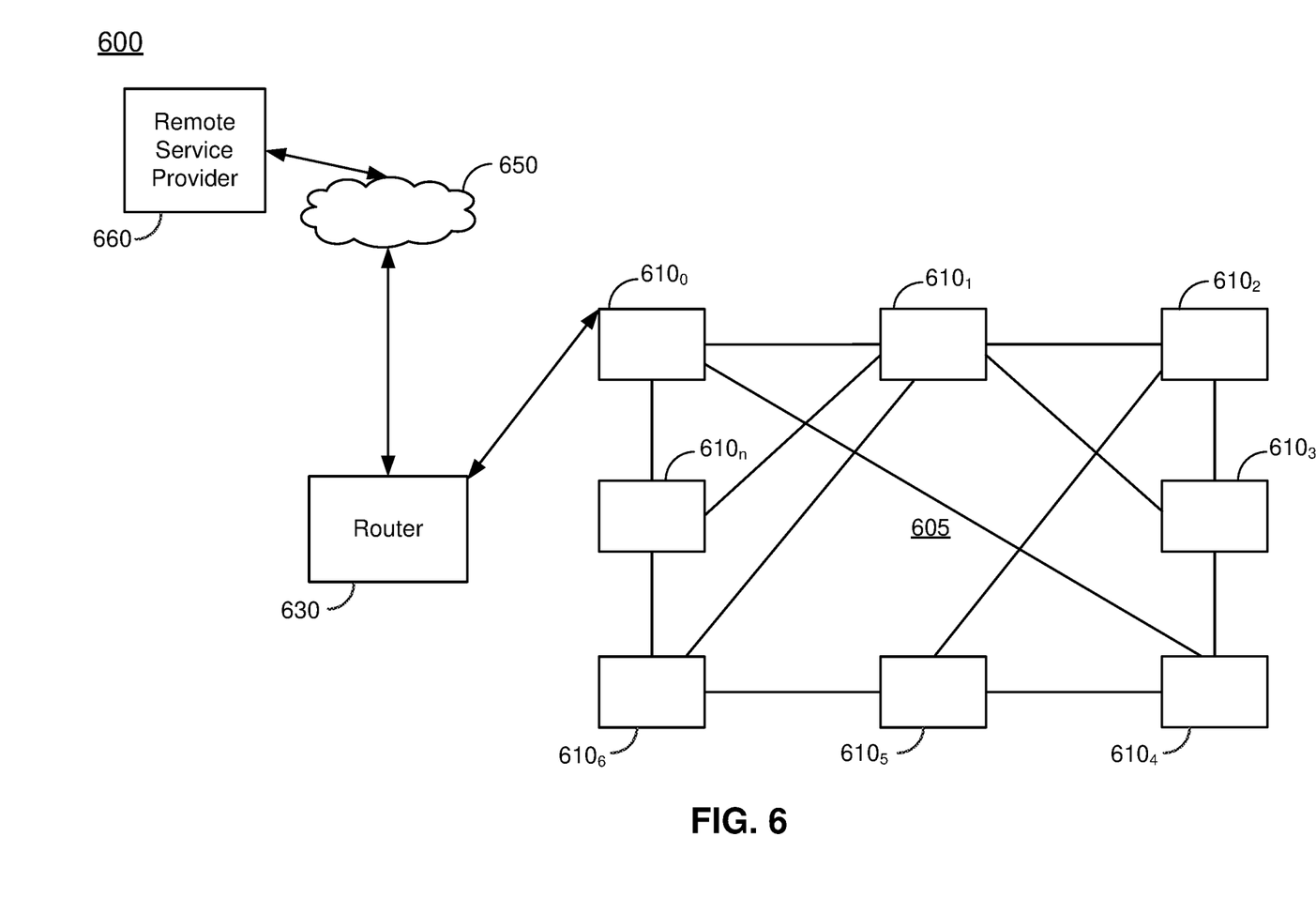
FIG. 6 is a block diagram of a system in accordance with an embodiment.

Referring now to FIG. 6, shown is a high level diagram of a network in accordance with an embodiment. As shown in FIG. 6, a network 600 includes a variety of devices, including smart devices such as IoT devices, routers and remote service providers. In the embodiment of FIG. 6, a mesh network 605 may be present, e.g., in a building having multiple IoT devices $610_{0-n}$. Such IoT devices may include dual RF paths and matching networks as described herein. As shown, at least one IoT device 610 couples to a router 630 that in turn communicates with a remote service provider 660 via a wide area network 650, e.g., the internet. In an embodiment, remote service provider 660 may be a backend server of a utility that handles communication with IoT devices 610. Understand while shown at this high level in the embodiment of FIG. 6, many variations and alternatives are possible.

While the present disclosure has been described with respect to a limited number of implementations, those skilled in the art, having the benefit of this disclosure, will appreciate numerous modifications and variations therefrom. It is intended that the appended claims cover all such modifications and variations.

What is claimed is:

1. An integrated circuit comprising:
  a semiconductor die comprising:
    a first radio frequency (RF) circuit including a first low noise amplifier (LNA) and a first mixer, the first RF circuit configured to receive and process a first RF signal having a sub-gigahertz (GHz) frequency to output a first lower frequency signal and to transmit RF signals having the sub-GHz frequency;
    a second RF circuit including a second LNA and a second mixer, the second RF circuit configured to receive and process a second RF signal having a frequency of at least substantially 2.4 GHz to output a second lower frequency signal and to transmit RF signals at the at least substantially 2.4 GHz;
    shared analog circuitry coupled to the first RF circuit and the second RF circuit, the shared analog circuitry to receive at least one of the first RF signal or the second RF signal and output a digital output signal;
    a digital circuit coupled to the shared analog circuitry, the digital circuit to recover message information from the digital output signal; and
    a controller coupled to the first RF circuit and the second RF circuit, wherein in a first mode, the controller is to disable the first RF circuit and enable the second RF circuit, the controller to communicate onboarding information with a network component of a network via the second RF circuit, and after the integrated circuit is onboarded into the network based at least in part on the onboarding information, the controller is to disable the second RF circuit and enable the first RF circuit.

2. The integrated circuit of claim 1, wherein:
  the first RF circuit is coupled to a first matching network, the first matching network configured to impedance match to a first antenna, the first antenna to receive the first RF signal; and
  the second RF circuit is coupled to a second matching network, the second matching network configured to impedance match to a second antenna, the second antenna to receive the second RF signal.

3. The integrated circuit of claim 2, wherein the integrated circuit is to couple to the first matching network via a first pad of the semiconductor die and to couple to the second matching network via a second pad of the semiconductor die, the first matching network and the second matching network external to the integrated circuit.

4. The integrated circuit of claim 2, further comprising a programmable harmonic filter coupled to the second matching network, wherein the programmable harmonic filter is enabled when communication is via the first RF circuit, to prevent emission of the first RF signal through the second matching network.

5. The integrated circuit of claim 1, wherein when the integrated circuit is integrated in a system, the first RF circuit and the second RF circuit are configured for operation at the sub-GHz frequency, the first RF circuit is to couple to a first antenna and the second RF circuit comprises a diversity path to be coupled to a diversity antenna, wherein the first antenna and the diversity antenna are configured for a same band of operation.

6. The integrated circuit of claim 1, wherein the shared analog circuitry comprises:
  a programmable gain amplifier to receive the first lower frequency signal when the first RF circuit is active and to receive the second lower frequency signal when the second RF circuit is active; and
  an analog-to-digital converter (ADC) coupled to an output of the programmable gain amplifier, the ADC to output the digital output signal to the digital circuit.

7. The integrated circuit of claim 1, wherein the semiconductor die further comprises a frequency synthesizer to generate a first mixing signal for the first mixer when the first RF circuit is active and to generate a second mixing signal for the second mixer when the second RF circuit is active, wherein the first mixer and the second mixer comprise a shared complex mixer.

8. A system comprising:
  at least one antenna to receive radio frequency (RF) signals of a sub-gigahertz (GHz) protocol and RF signals of a 2.4 GHz protocol;
  a first matching network coupled to the at least one antenna, the first matching network to impedance match the at least one antenna and a first RF circuit of an integrated circuit;
  a second matching network coupled to the at least one antenna, the second matching network to impedance match the at least one antenna and a second RF circuit of the integrated circuit;
  the integrated circuit coupled to the first matching network and the second matching network, the integrated circuit comprising:
    the first RF circuit including a first low noise amplifier (LNA), the first RF circuit configured to receive and process the RF signals of the sub-GHz protocol;
    the second RF circuit including a second LNA, the second RF circuit configured to receive and process the RF signals of the 2.4 GHz protocol;
    shared circuitry coupled to the first RF circuit and the second RF circuit, the shared circuitry to receive at least one of the RF signals of the sub-GHz protocol or the RF signals of the 2.4 GHz protocol and output a digital output signal; and
    a digital circuit coupled to the shared circuitry, the digital circuit to recover message information from the digital output signal; and
  a programmable harmonic filter coupled to the second matching network, wherein the programmable harmonic filter is enabled when communication is via the first RF circuit, to prevent emission of a harmonic of the RF signals of the sub-GHz protocol through the second matching network.

9. The system of claim 8, wherein at least one of the first matching network or the second matching network is external to the integrated circuit.

10. The system of claim 8, wherein the first matching network comprises:
a first matching network path having at least one first inductor coupled in series between the at least one antenna and the first RF circuit and at least one first capacitor coupled in parallel to the at least one first inductor; and
a second matching network path having at least one second inductor coupled in series between the at least one antenna and at least one power amplifier of the first RF circuit and at least one second capacitor coupled in parallel to the at least one second inductor.

11. The system of claim 8, further comprising a controller coupled to the first RF circuit and the second RF circuit, wherein in a first mode, the controller is to disable the first RF circuit and enable the second RF circuit, the controller to communicate onboarding information with a network component of a network via the second RF circuit.

12. The system of claim 11, wherein after the system is onboarded into the network based at least in part on the onboarding information, the controller is to disable the second RF circuit and enable the first RF circuit.

13. The system of claim 8, wherein the programmable harmonic filter comprises a programmable capacitor included in the integrated circuit and an inductor coupled between the programmable capacitor and the at least one antenna, wherein the programmable capacitor is decoupled from the inductor when communication is via the second RF circuit.

14. The system of claim 8, further comprising a RF switch coupled between the at least one antenna, and the first and second matching networks.

15. The system of claim 8, further comprising a controller coupled to the first RF circuit and the second RF circuit, wherein when the system comprises a vehicle system, the controller is to configure the first RF circuit and the second RF circuit to receive and process the RF signals of the sub-GHz protocol.

16. An integrated circuit comprising:
a first radio frequency (RF) circuit including a first low noise amplifier (LNA) and a first mixer, the first RF circuit to receive and process a first RF signal having a sub-gigahertz (GHz) frequency to output a first lower frequency signal;
a second RF circuit including a second LNA and a second mixer, the second RF circuit to receive and process a second RF signal having a frequency of at least substantially 2.4 GHz to output a second lower frequency signal;
shared analog circuitry coupled to the first RF circuit and the second RF circuit, the shared analog circuitry to receive at least one of the first lower frequency signal or the second lower frequency signal and output a digital output signal, wherein in a first mode the first RF circuit and the second RF circuit are configured for operation at the sub-GHz frequency, the first RF circuit to couple to a first antenna and the second RF circuit comprises a diversity path to couple to a diversity antenna; and
a digital circuit coupled to the shared analog circuitry, the digital circuit to recover message information from the digital output signal.

17. The integrated circuit of claim 16, wherein:
the first RF circuit is to couple to a first matching network, the first matching network configured to impedance match to the first antenna; and
the second RF circuit is to couple to a second matching network, the second matching network configured to impedance match to the diversity antenna.

18. The integrated circuit of claim 17, wherein the second matching network is to couple to a programmable harmonic filter to be enabled when communication is via the first RF circuit, to prevent emission of the first RF signal through the second matching network.

19. The integrated circuit of claim 18, wherein the programmable harmonic filter comprises a programmable capacitor included in the integrated circuit and an inductor to couple between the programmable capacitor and the first antenna, wherein the programmable capacitor is to be decoupled from the inductor when communication is via the second RF circuit.

20. The integrated circuit of claim 16, further comprising a controller coupled to the first RF circuit and the second RF circuit, wherein in a second mode, the controller is to disable the first RF circuit and enable the second RF circuit and communicate onboarding information with a network component of a network via the second RF circuit, and thereafter disable the second RF circuit and enable the first RF circuit.

* * * * *